United States Patent [19]

Bakermans

[11] 4,345,810

[45] Aug. 24, 1982

[54] INTEGRATED CIRCUIT CONNECTOR

[75] Inventor: Johannes C. W. Bakermans, Harrisburg, Pa.

[73] Assignee: AMP Incorporated, Harrisburg, Pa.

[21] Appl. No.: 197,402

[22] Filed: Oct. 16, 1980

[51] Int. Cl.³ .......................................... H01R 13/639
[52] U.S. Cl. ........................... 339/75 MP; 339/17 CF
[58] Field of Search ............. 339/75 MP, 17 CF, 174, 339/176 MP, 91 R

[56] References Cited

U.S. PATENT DOCUMENTS

| 3,940,786 | 2/1976 | Sheingold et al. | 357/74 |
| 3,942,854 | 3/1976 | Klein et al. | 339/75 MP |
| 4,220,383 | 9/1980 | Sheingold et al. | 339/17 CF |

Primary Examiner—Eugene F. Desmond
Attorney, Agent, or Firm—Frederick W. Raring

[57] ABSTRACT

A clamping lid for an electrical connector is disclosed, the connector being of the type intended for a rectangular integrated circuit package. The connector comprises a rectangular housing having a central well which receives the IC package and having contacts mounted in the side rails of the connector which engage the terminal pads on the IC package when it is placed in the well. The clamping lid comprises a flat stamped sheet metal member dimensioned to be mounted on the housing in covering relationship to the IC package. The lid is centrally open and has four side rails, three of these side rails having a pair of cantilever springs associated therewith. The springs of each pair extend from adjacent corners of the lid towards each other and overlap each other. These springs provide two zones or areas along each side rail in which clamping pressure is applied to the package. The fourth side rail has associated therewith a single clamping spring and a substrate biasing arm which engages one corner of the substrate when the lid is assembled to the housing and biases the substrate to a precisely predetermined position so that the contact terminals in the housing engage the terminal pads on the IC package substrate.

9 Claims, 6 Drawing Figures

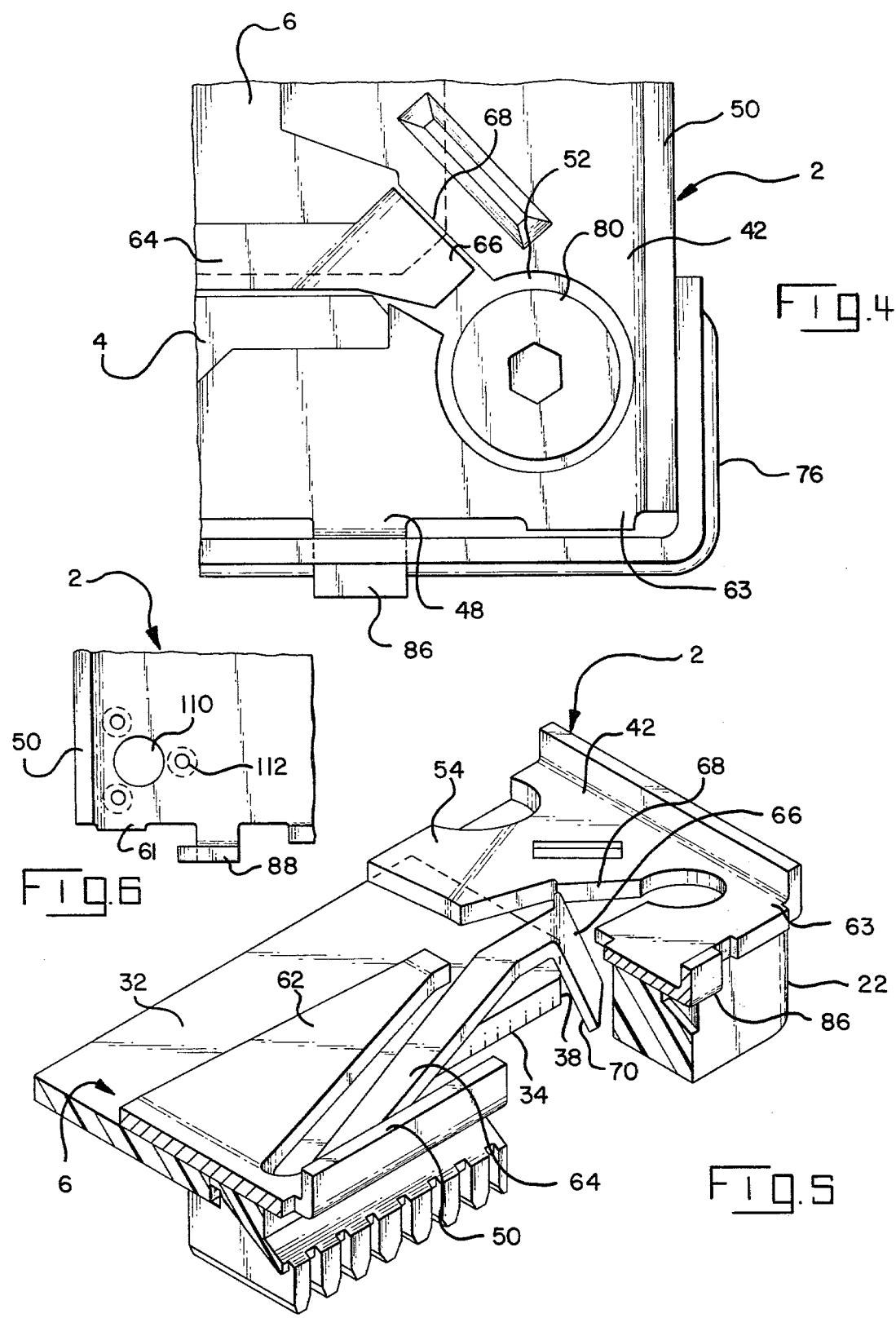

INTEGRATED CIRCUIT CONNECTOR

FIELD OF THE INVENTION

This invention relates to clamping lids of the type which are used with connectors for integrated circuit packages and which serve to clamp the substrate of the integrated circuit package against the contact terminals in the connector. The invention is disclosed and described with reference to a connector intended to receive a square integrated circuit package of the type having terminal pads along all four of its marginal side edge portions, however, the principles of the invention can be used with other types of connectors for IC packages.

BACKGROUND OF THE INVENTION

It is now common practice in the electronics industry to package small integrated circuits on a substrate of ceramic or plastic and provide conductors on the substrate which extend to the marginal side edge portions of the substrate. The connectors for IC packages of this type typically comprise an open rectangular frame having a central well therein which receives the substrate and having contact terminals therein which engage the terminal pads on the substrate when it is positioned in the well. It is necessary to provide some means to ensure that the contact terminals in the connector housing will be urged against the terminal pads on the substrate with a force sufficient to establish electrical connections having the required electrical characteristics for the system and to this end it has become common to provide a separate lid for the connector housing which is assembled to the housing in covering relationship to the substrate. The lid has integral pressure applying springs which bear against the upwardly facing surface of the substrate and thereby maintains the required contact pressure for the terminal pads and the contact terminals. A commonly used type of integrated circuit package accommodates an integrated circuit chip having 68 terminal areas thereon so that the substrate, therefore, has a total of 68 terminal pads positioned in rows along its marginal side edges. The substrate is relatively small, however, it is nonetheless necessary to maintain an adequate contact force at each electrical interface of a terminal to one of the terminal pads on the substrate. The spring means in the lid must therefore be capable of developing relatively high forces and imposing these forces on the substrate in order to maintain and develop these contact forces. The present invention, in accordance with one aspect thereof, is directed to the achievement of a lid having improved spring means for biasing the substrate of an IC package against the terminals in a connector.

It is also common practice in connectors of the type described above to provide a biasing means in the connector housing which bears against one corner of the IC package substrate and biases it to a precisely predetermined position in the connector so that the terminals in the connector will be in engagement with the terminal pads on the substrate. In accordance with present practice, this biasing means is commonly provided as a separate spring device in the connector housing, see U.S. Pat. No. 4,220,383. While this method of biasing the IC substrate to its proper position in the connector is satisfactory, it would be desirable to eliminate the separate spring in the housing for this purpose, and thereby simplify the construction of the connector assembly. The present invention, in accordance with a further aspect thereof, is directed to the achievement of a housing lid having an integral biasing means in combination with a suitable pressure spring means so that the need for a separate biasing spring in the housing is eliminated.

One form of clamping lid in accordance with the invention comprises a flat stamped and formed sheet metal member which is dimensioned to be mounted on the housing in covering relationship to the IC package and which has along three of its sides, a pair of overlapping cantilever springs which extend towards each other and parallel to the sides of the sheet metal member. The springs are generally triangular and each spring extends from a location adjacent to one of the corners of the sheet metal member towards an adjacent corner and past the associated spring which extends from the adjacent corner. By virtue of the provision of these three pairs of springs along three of the sides of the member, clamping forces are applied to the substrate at six locations distributed around the periphery of the substrate. An individual clamping spring is provided adjacent to the remaining side of the rectangular member and, in addition, a substrate biasing arm is formed adjacent to this single spring. The biasing arm is in the form of a cantilever having a laterally directed free end which is formed such that when the lid is assembled to a housing in which an IC package has been placed, the free end of the biasing arm engages one corner of the substrate and pushes it to a precisely predetermined location in the housing while the lid is being placed on the housing. After the substrate has been so positioned, the springs in the lid move relatively against the surface of the substrate and apply the clamping force against the substrate, which is required to ensure adequate contact force at each of the electrical interfaces of the contact terminals in the housing in the terminal pads on the IC package substrate.

DRAWINGS

FIG. 4 is a fragmentary plan view of one corner of the assembly shown in FIG. 2.

FIG. 5 is a fragmentary perspective view with parts broken away of the corner of the assembly shown in FIG. 4, showing particularly details of the substrate biasing arm.

FIG. 6 is a fragmentary plan view of an alternative embodiment.

PRACTICE OF THE INVENTION

Figure 1:
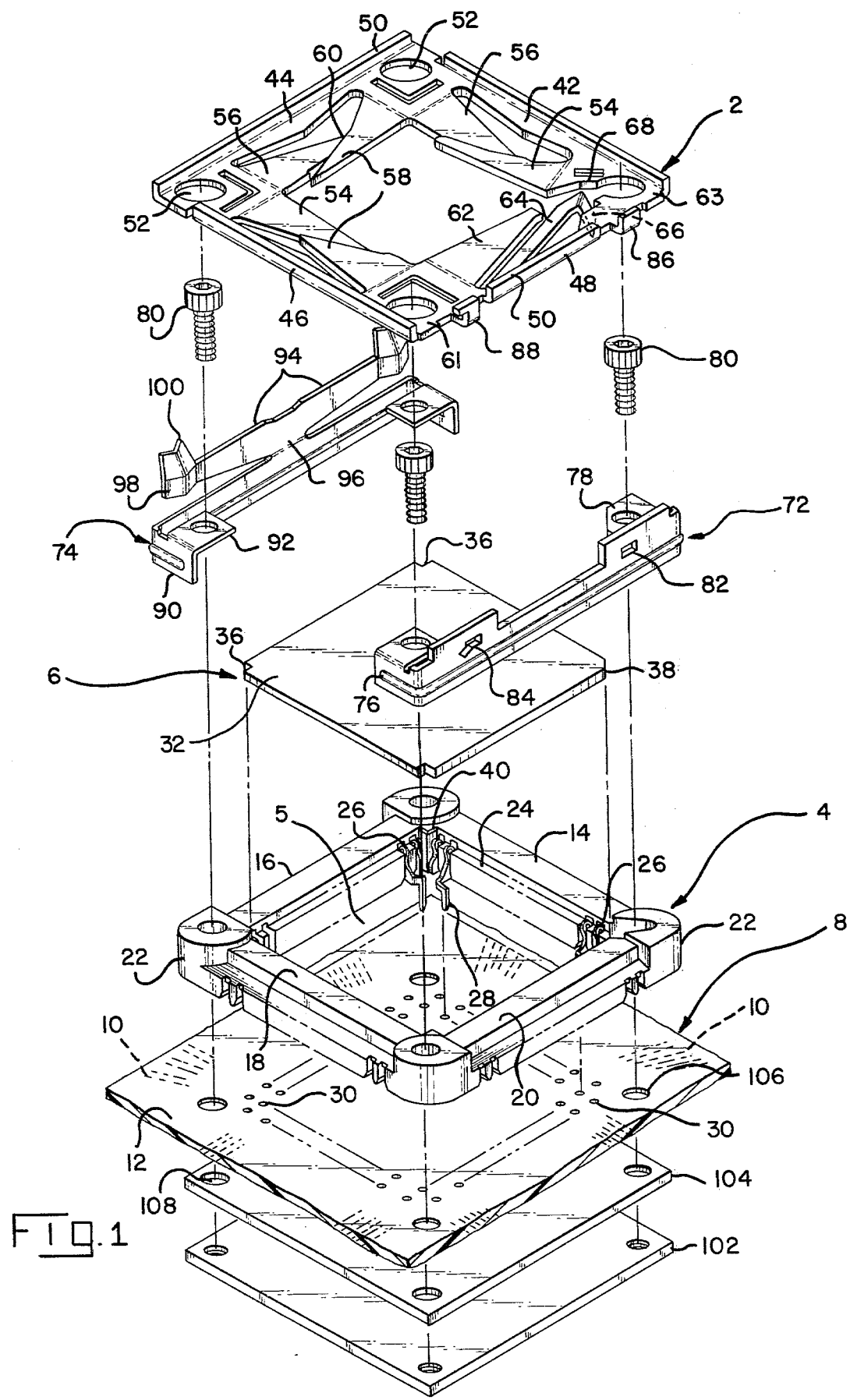
FIG. 1 is a perspective exploded view showing all of the parts of a connector assembly for a square integrated circuit package.

FIG. 1 shows all of the parts of a connector assembly for connecting terminal pads on the underside of a square integrated circuit package 6 to conductors 10 on a circuit board 8. The assembly comprises a clamping lid 2, a rectangular connector housing 4 which has a central well 5 therein dimensioned to receive the IC package 6. An integrated circuit (not shown) is centrally mounted on the downwardly facing surface 34 of the substrate of the IC package and conductors extend from this integrated circuit to the marginal side edge portions of the substrate and have terminal pad portions located along the marginal side edges of the substrate which are engaged by contact terminals 26, as described below.

The housing 4 may be of suitable molded plastic material and has four side rails 14, 16, 18, 20, which surround the central IC package receiving well 5. The corners 22 of the housing are enlarged, as shown, and are provided with openings for mounting screws, as shown at 80 to secure the housing to the circuit board. A ledge 24 extends along each side rail 14-20 on its inwardly facing surface for supporting the substrate of the integrated circuit package and suitable contact terminals 26 are mounted in cavities in the housing which intersect this ledge so that contact portions of the terminals extend above the surface of the ledge 24. The terminals have depending solder tab portions 28 which extend below the housing and which are received in openings 30 in the circuit board. The conductors on the circuit board will usually be provided on the downwardly facing surface thereof, as shown.

The substrate of the IC package 6 has three of its corners notched, as shown at 36, and these notches are dimensioned to receive complementary projecting portions 40 in the corners of the well 5 of the housing 4 so that when the substrate is positioned in the well with the projections 40 snugly received in the notches 36, the terminal pads on the downwardly facing surface 34 of the substrate will be in engagement with the contact portions of the terminals 26. The fourth corner 38 of the substrate is beveled, as shown in FIG. 1, and is dimensioned to be engaged by a camming means on a biasing arm which forms part of the lid 2, as will be explained below.

The clamping lid 2 is produced by stamping and forming a suitable high strength resilient material, such as a good quality carbon steel, which can be heat treated after stamping and forming to develop the required spring properties. The clamping lid is centrally open and has four side rails 42, 44, 46, and 48. Flanges, as shown at 50, are provided on the edges of these side rails to enhance the stiffness of the lid and openings, as shown at 52, are provided in each of the four corners for clamping the lid against the housing, as desired.

Three of the side rails, 42, 44, and 46 have a pair of cantilever clamping springs 54, 56 associated therewith for clamping the substrate against the contact terminals in the housing. Each spring extends from a location adjacent to one of the corners of the lid towards an adjacent corner and the free end portions 58 of the springs overlap each other. Each pair of springs has adjacent side edges 60 which are substantially against each other and the springs are formed by simply shearing the platelike member after the blanking operations have been carried out, along shear lines extending diagonally between the two associated cantilever springs.

The side rail 48 has a single cantilever spring 62 associated therewith and has, in addition, a substrate biasing arm 64 which extends beside the cantilever spring 62. Both of the members extend from the corner 61 of the platelike member, generally towards the corner 63. The biasing arm 64 extends beyond the free end of the spring 62 and has a downwardly turned free end portion 66, see FIG. 5, which is formed from material in the corner 63 of the platelike member so that a notch 68 is formed in this corner. The downwardly turned end 66 has an inwardly directed surface 70 which is located such that it bears against the beveled corner 38 of the substrate. As was shown in FIG. 5, this downwardly turned end portion 66 of the biasing arm 64 inclined such that it will engage the corner 38 of the substrate, and cam the substrate generally leftwardly, as viewed in FIG. 5, as the lid is progressively moved against the upper surface of the connector housing.

The lid 2 is manufactured by stamping and forming sheet stock material, preferably of spring steel, as mentioned above, and bending the cantilever springs 54, 56 and 62 downwardly from the original plane of the material. When the springs 54, 56 are bent downwardly, they should be bent away from each other, as well as downwardly, so that their adjacent edges do not touch each other and cause binding. The biasing arm 64 is also bent downwardly and after forming, the end 66 of this arm extends below the free ends of the clamping springs so that when the lid is assembled to the housing, the free end 66 of this clamping arm will engage the corner 38 of the substrate and bias it to its proper position in the housing prior to engagement of the springs with the upper surface 32 of the substrate.

FIG. 1 shows hinging and latching means for hinging the lid to the housing 4 and holding it in an assembled latched position. This hinging and latching means comprises hinge frame 72 and latch arm frame 74, both of these members being in the form of relatively thick sheet metal strips dimensioned to be mounted on the side rails 20 and 16 of the housing. The hinge frame 72 has inwardly turned flanges 76 at its end and ears 78 which extend inwardly and over the corner portions of the housing 4, these ears 78 being provided with suitable openings for mounting screws 80, as shown. Openings 82, 84 are provided in the hinge frame for the reception of hinge ears 86, 88 which extend from the side rail 48 of the lid 2. As is apparent from the drawing, the opening 84 is adapted to receive the hinge ear 88 which has a laterally extending portion at its end for securing the lid to the hinge frame. The opening 82 is a simple rectangular opening dimensioned to receive the generally L-shaped hinged ear 86 on the lid 2. It will be apparent that when these ears are positioned in the openings 82, 84, the lid will be hinged to the housing and can be flipped from its lowered position of FIG. 2 upwardly to permit removal of the integrated circuit package 6.

Figure 2:
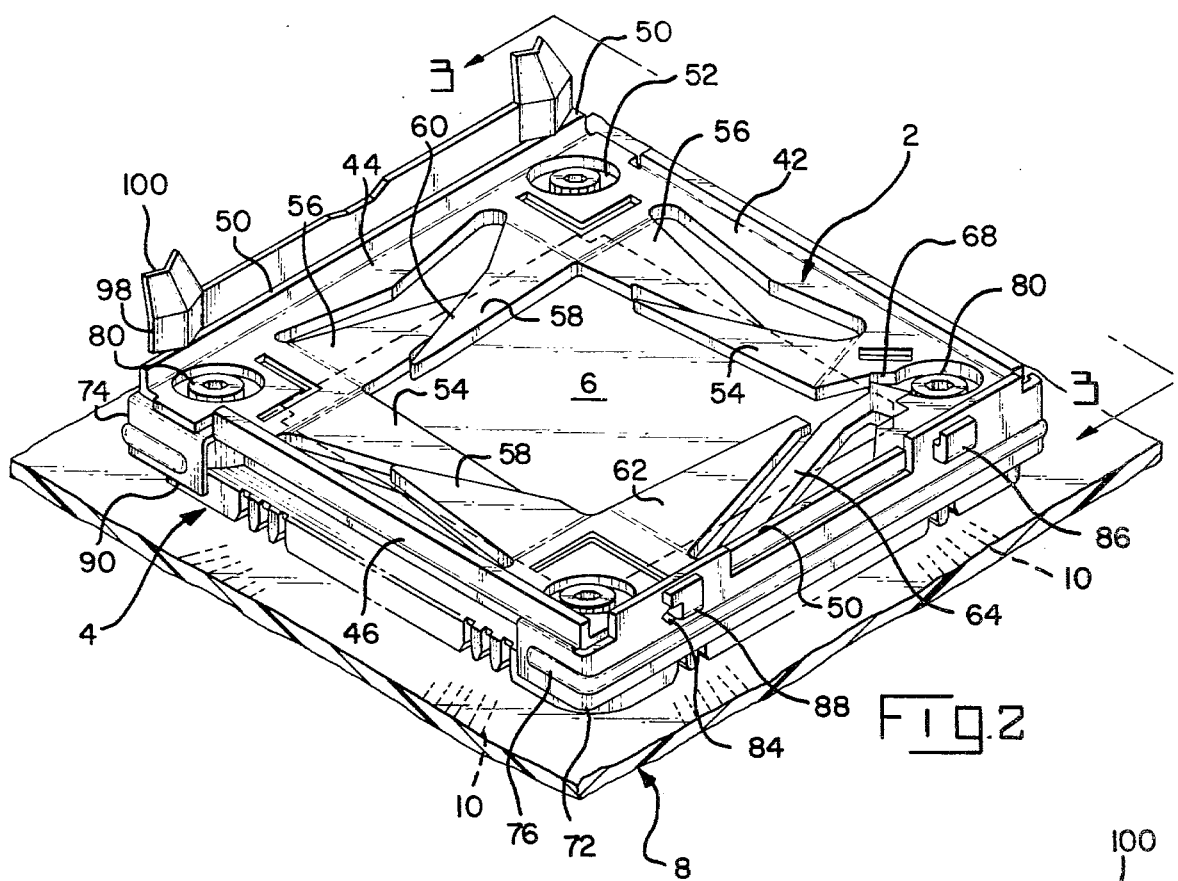
FIG. 2 is a perspective view of the parts of the connector assembled to each other on a circuit board.

The latch arm frame 74 similarly comprises an elongated strip having flanges 90 and ears 92 on its ends for mounting on the housing frame against the side rail 16. The latching means comprises latch arms, as shown at 94, which are integral with the frame, as shown at 96, and which have enlarged free ends 98. The free ends of these latch arms are inwardly formed relatively to the lid so that when the parts are assembled, as shown at FIG. 2, the downwardly facing edges of these ends will project over the ends of the flange 50 which extends along the side rail 44. In the embodiment shown, these enlarged ends 98 have inclined upper surface portions 100 which provide a lead-in and camming surface for the lid when it is slipped downwardly from its open position. In other words, the flange 50 of the lid will move over the inclined surfaces 100, thereby flexing the arms 94 outwardly until the edge of the flange 50 is beneath the ends of the latching arms, at which time the latching arms will snap inwardly and latch the lid in its assembled relation, as shown in FIG. 2.

The connector housing 4 and the latching means 72, 74 are assembled to the circuit board by aligning a metallic clamping plate 102 with the circuit pattern and with the threaded holes in the plate 102 in alignment with the holes 106 in the circuit board and the holes in the housing 4. An insulating plate 104, having oversized holes 108 therein, is located between the metallic clamping plate 102 and the downwardly facing surface of the circuit board 8. Thereafter, the housing 4, the hinge frame 72, and the latch arm frame 74 are positioned on the upper surface of the circuit board with the hinge frame and latch arm frame against the housing, and the screws 80 are passed through the aligned openings in these members and threaded into the threaded openings in the plate 102. The lid 2 can then be assembled to the housing by merely passing the ears 86, 88 through the openings 82, 84 in the hinge frame 72. The integrated circuit can then be connected to the conductors 10 on the circuit board by merely positioning the substrate of the IC package in the well 5 of the housing and then lowering the lid 2 until it is latched in its assembled position, as shown in FIG. 2. As explained above, during such lowering of the lid, the biasing arm will initially engage the corner 38 of the substrate and position the substrate in its proper location in the housing and thereafter the springs 54, 56, 62 will move against the upwardly facing surface 32 of the substrate and apply the required clamping force against the substrate.

Under some circumstances, it may be preferred to rely entirely on clamping screws, rather than the hinge and latch arrangement shown, for holding the lid on the housing. Under such circumstances, the hinge frame and latch frame are not assembled to the housing, but rather, the lid is assembled directly to the housing having the substrate therein. FIG. 6 shows the modifications to the clamping lid which are made when the lid is assembled directly to the housing. As shown, the openings 110 are made of a somewhat smaller diameter so that the screws 80 cannot pass through the opening but will bear against the upper surface of the lid. Also, downwardly extending dimples 112 are provided on the lid to compensate for the fact that the hinge frame and the latch frame 72, 74 are not included in the assembly. These dimples thus have a height substantially equal to the thickness of the ears 78, 92 of these two members.

The advantages realized with a clamping lid, in accordance with the invention, can be fully appreciated from the following discussion of the problems which are presented in the provision of the clamping lid to a connector of the type shown in FIG. 1. At the outset, it should be recognized that the substrate is relatively small, having a length along each side thereof of 24.13 mm and that on its underside, it has 68 terminal pads, 17 terminal pads along each of the four sides of the substrate. A substantial force must be applied to the upper surface 32 of the substrate to ensure that good electrical contact will be achieved between the contact portions of the terminals 26 in the housing and the terminal pads on the underside of the substrate. When the terminal pads and the terminals 26 are gold plated, the contact force for each contact must be at least 100 gms so that the total force applied to the upper surface 32 of the substrate must be at least 6.8 kg. If the contact terminals 26 and the terminal pads on the substrate are tin plated rather than gold plated, the forces required for each contact terminal is 200 grams so that the total force required is at least 13.6 kg. Obviously, the design forces should be somewhat greater than the minimum forces of 100 and 200 gms noted above, in order to provide the margin of safety.

Ideally, the contact forces which are applied to the upper surface 32 of the substrate should be uniformly distributed along all four side portions of the upper surface 32 in order that these forces will be uniformly transmitted through the substrate to the individual electrical junctions between the terminal pads on the underside of the substrate and the contact terminals 26. A spring means which would achieve a completely uniform force distribution is not practical and, therefore, it is desirable, as an alternative, to provide a plurality of individual springs which apply the forces at different locations around the side portions of the substrate. The disclosure embodiment of the invention achieves this desirable result in that forces are applied at the ends of the three pairs of associated springs 54, 56, at the end of the spring 62, and some contact force is applied by the biasing arm 64 at its end when the lid is assembled to the substrate. Thus, the total force applied to the substrate is distributed among eight force applying spring members which are substantially uniformly distributed around the periphery of the substrate.

A further problem which must be faced in the design of a clamping lid arises from the fact that the thickness of a substrate of the IC package 6 will vary over a relatively wide range, particularly if this substrate is of ceramic, as is usually the case. The normal standard thickness for substrates of this type is 1.52 mm with a tolerance range of $\pm 0.15$ mm. It follows that each of the individual spring members must be such that the minimum required force will be developed if these spring members are deflected by a minimum amount when the substrate is of a minimum thickness, 1.37 mm and, in addition, the springs must be capable of deflecting an additional 0.30 mm without overstressing, in the event that the thickness of the substrate is at the upper end of the tolerance range and has a thickness of 1.67 mm. A spring capable of developing the minimum force required for each spring in the lid can easily be designed if the permissible deflection range is quite narrow, but such a spring may be overstressed if it is deflected by an amount which exceeds the maximum deflection discussed above. It becomes more difficult to provide a spring capable of both developing the minimum force required under conditions of minimum deflection and capable of withstanding the conditions of maximum deflection without overstressing.

The springs of the lid disclosed are capable of these relatively severe requirements for a number of reasons, as follows. The springs are relatively long, as is apparent, each of the cantilever springs 54, 56 having a length which is greater than about one-half of the length of the substrate along each of its side edges. Furthermore, the triangular shape of the springs 54, 56 is advantageous in that it results in an extremely efficient use of the material which is available for these springs (the material of the blank for the clamping lid from which the springs are struck). The triangular springs have a maximum width at their inner ends, or adjacent to their fixed ends, which is in a cantilever spring loaded at its end, the zone of maximum loading. This maximum loading can then be distributed across a relatively wide cross section at the fixed end of each spring. The springs need not be wide at their free ends, since the loading of the deflected cantilever spring decreases along is length.

Figure 3:
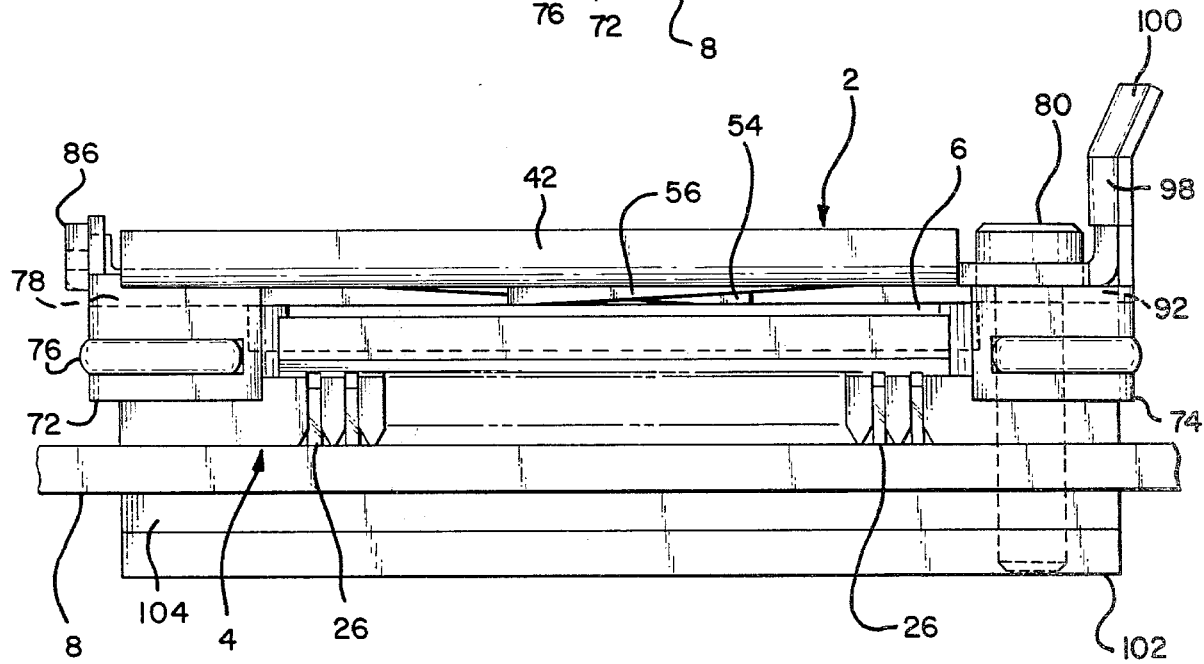
FIG. 3 is a side view looking in the direction of the arrows 3—3 of FIG. 2.

Springs of the configuration shown are also advantageous in that the free ends of the springs 58 and 60 are located inwardly from the outer margins of the clamping lid and these free ends will therefore bear against the upper surface of the clamping lid. It will be apparent from FIG. 1, that the clamping lid is substantially oversized relative to the dimensions of the substrate of the IC package 6 and the side rails 42–48 of the clamping lid are located beyond the side edges of the substrate in the assembly shown in FIG. 3. A clamping lid, in accordance with the invention, locates the free ends of all of the springs on the surface of the substrate, a condition which is, of course, necessary if the force developed by these springs is to be transmitted to the contact terminals.

While the principles of the invention can be used for a variety of types of connector assemblies for Integrated Circuit packages, the embodiment shown is particularly intended for a standard IC package having a length along each side of 24.13 mm. It has been determined that a clamping lid, in accordance with the invention, for this type of IC package can be produced of a carbon steel, AISI 1050, having a thickness of 0.813 mm. With this material and optimum heat treatment after stamping and forming, a minimum force of 17 kg will be applied to the substrate when the lid is assembled to the housing. This total force, 17 kg, provides a force of 250 grams per contact, which is substantially in excess of the minimum requirement noted above, of 200 grams per contact.

I claim:

1. A clamping lid for an electrical connector of the type comprising a rectangular housing having a rectangular well extending into one major surface thereof, said well being dimensioned to receive an IC package of the type comprising a rectangular substrate, an integrated circuit chip mounted on said substrate, and terminal pads on one surface of said substrate, said terminal pads being arranged in rows extending alongside margins of said one surface, said housing having contact terminals therein for contacting said terminal pads, said lid being intended for assembly to said housing in covering relationship to said IC package and having hold-down spring means engageable with said IC package for clamping said IC package against said contact terminals, said clamping lid comprising:

a flat stamped and formed resilient sheet metal member dimensioned to be mounted on said housing in covering relationship to said IC package, said member having four side rails extending between the four corners of said sheet metal member, at least two of said side rails, which are opposite, each having a pair of cantilever hold-down springs integral therewith, said cantilever springs extending from two adjacent corners of said member towards each other and having overlapping free ends, said springs extending in opposite oblique directions, with respect to the plane of said member, from one side of said member whereby, upon placement of said IC package in said well and subsequent placement of said lid on said housing with said one side of said housing opposed to said IC package, said cantilever springs bear against said IC package and are flexed towards the plane of said lid thereby imposing clamping forces on said IC package.

2. A clamping lid as set forth in claim 1, each of said cantilever springs being generally triangular, each spring having a base which is integral with its associated side rail at one of said adjacent corners, and each triangular spring having sides which extend to an apex located proximate to the other one of said adjacent corners.

3. A clamping lid as set forth in claim 2, each of said pairs of cantilever springs having adjacent side edges which are adjacent to, but spaced from each other, said side edges having been formed by shearing said sheet metal member along a shear line extending between said springs.

4. A clamping lid as set forth in claim 2, three of said side rails having a pair of said cantilever springs integral therewith.

5. A clamping lid as set forth in claim 4, the fourth one of said side rails having a single cantilever spring integral therewith and having, in addition, a substrate biasing means integral therewith, said biasing means being engageable with said substrate and being effective to bias said substrate in said well to a precisely predetermined location in said well.

6. A clamping lid as set forth in claim 5, said biasing means comprising a cantilever biasing arm having a free end which is engageable with one corner of said substrate, said arm extending obliquely with respect to the plane of said member in from said one side of said member.

7. A clamping lid for an electrical connector of the type comprising a rectangular housing having a rectangular well extending into one major surface thereof, said well being dimensioned to receive an IC package of the type comprising a rectangular substrate, an integrated circuit chip mounted on said substrate, and terminal pads on one surface of said substrate, said terminal pads being arranged in rows extending alongside margins of said one surface, said housing having contact terminals therein for contacting said terminal pads, said lid being intended for assembly to said housing in covering relationship to said IC package and having hold down spring means engageable with said IC package for clamping said IC package against said contact terminals, said clamping lid comprising:

a flat stamped and formed resilient sheet metal member dimensioned to be mounted on said housing in covering relationship to said IC package, said member having four side rails extending between the four corners of said sheet metal member, substrate biasing means integral with one of said side rails, said substrate biasing means comprising a resilient biasing arm engageable with one corner of said substrate and being effective, upon assembly of said lid to said housing, to bias said substrate to a precisely predetermined position in said well with said contact terminals in contact with said terminal pads.

8. A clamping lid as set forth in claim 7, said biasing arm comprising a cantilever arm extending from, and beside one of said rails and having a free end which is engageable with said corner of said substrate.

9. A clamping lid as set forth in claim 8, said free end of said cantilever arm having camming means thereon, said camming means being movable across said one corner of said substrate and being effective to bias said substrate to said predetermined position.

* * * * *